(12) United States Patent
Varadarajan et al.

(10) Patent No.: US 12,719,480 B2
(45) Date of Patent: Aug. 25, 2026

(54) CLOCK AND DATA RECOVERY CIRCUITRY

(71) Applicant: TEXAS INSTRUMENTS INCORPORATED, Dallas, TX (US)

(72) Inventors: Sudarshan Varadarajan, Bangalore (IN); Karthikeyan Gunasekaran, Bangalore (IN); Jagannathan Venkataraman, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 69 days.

(21) Appl. No.: 18/525,175

(22) Filed: Nov. 30, 2023

(65) Prior Publication Data

US 2025/0183898 A1 Jun. 5, 2025

(51) Int. Cl.

| | |
|---|---|
| ***H03L 7/08*** | (2006.01) |
| ***H03L 7/085*** | (2006.01) |
| ***H03L 7/099*** | (2006.01) |

(52) U.S. Cl.

CPC ............ *H03L 7/0807* (2013.01); *H03L 7/085* (2013.01); *H03L 7/0995* (2013.01)

(58) Field of Classification Search

CPC ...... H03L 7/0807; H03L 7/085; H03L 7/0995

See application file for complete search history.

(56) References Cited

U.S. PATENT DOCUMENTS

| | | | | |
|---|---|---|---|---|
| 7,532,697 | B1 * | 5/2009 | Sidiropoulos | H04L 7/033 375/376 |
| 2017/0346618 | A1 * | 11/2017 | Ramezani | H03L 7/081 |
| 2021/0376841 | A1 * | 12/2021 | Okada | G06F 1/08 |
| 2023/0185248 | A1 * | 6/2023 | Abdulaziz | G04F 10/005 327/159 |
| 2024/0291495 | A1 * | 8/2024 | Lu | H03L 7/099 |

* cited by examiner

*Primary Examiner* — Janice N Tieu

(74) *Attorney, Agent, or Firm* — Xianghui Huang; Frank D. Cimino

(57) ABSTRACT

In an example, a circuit includes clock data recovery (CDR) circuitry having an input and an output. The circuit also includes a delay circuit having an input coupled to the output of the CDR circuitry, and having an output. The circuit includes a multi-phase oscillator having an input coupled to the output of the delay circuit, and having an output. The circuit also includes a divider having an input coupled to the output of the multi-phase oscillator, and having an output coupled to the input of the CDR circuitry.

21 Claims, 12 Drawing Sheets

CLOCK AND DATA RECOVERY CIRCUITRY

BACKGROUND

Data may be transferred through a wireline from a transmitter to a receiver. The data is tracked by the receiver and aligned at a point where the signal is at or near a maximum, so the data can be properly sampled. Clock and data recovery (CDR) circuitry at the receiver is useful for generating a clock signal based on the incoming data. The retrieved clock is used to re-time the incoming data. The data may also drift over time, and the drift is tracked. The clock and data may be aligned with a programmable delay cell.

SUMMARY

In at least one example of the description, a circuit includes clock data recovery (CDR) circuitry having an input and an output. The circuit also includes a delay circuit having an input coupled to the output of the CDR circuitry, and having an output. The circuit includes a multi-phase oscillator having an input coupled to the output of the delay circuit, and having an output. The circuit also includes a divider having an input coupled to the output of the multi-phase oscillator, and having an output coupled to the input of the CDR circuitry.

In at least one example of the description, a circuit includes CDR circuitry having an input and an output. The circuit includes a delay circuit having an input coupled to the output of the CDR circuitry, and having an output. The circuit also includes a multi-phase oscillator having an input coupled to the output of the delay circuit, and having an output. The circuit includes a divider having an input coupled to the output of the multi-phase oscillator, and having an output coupled to the input of the CDR circuitry. The circuit also includes a calibration circuit having a first input, a second input, and a third input, the first and second input coupled to the output of the delay circuit, and the third input coupled to the output of the multi-phase oscillator.

In at least one example of the description, a method includes providing a delay on an injection clock path from a delay circuit to a first phase of a multi-phase oscillator. The method also includes determining to update the delay with a correction value. The method includes, if the correction value is less than a threshold, altering the delay responsive to a control signal provided to the delay circuit. The method also includes, if the correction value exceeds the threshold, altering an injection point of the delay circuit to a second phase of the multi-phase oscillator.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
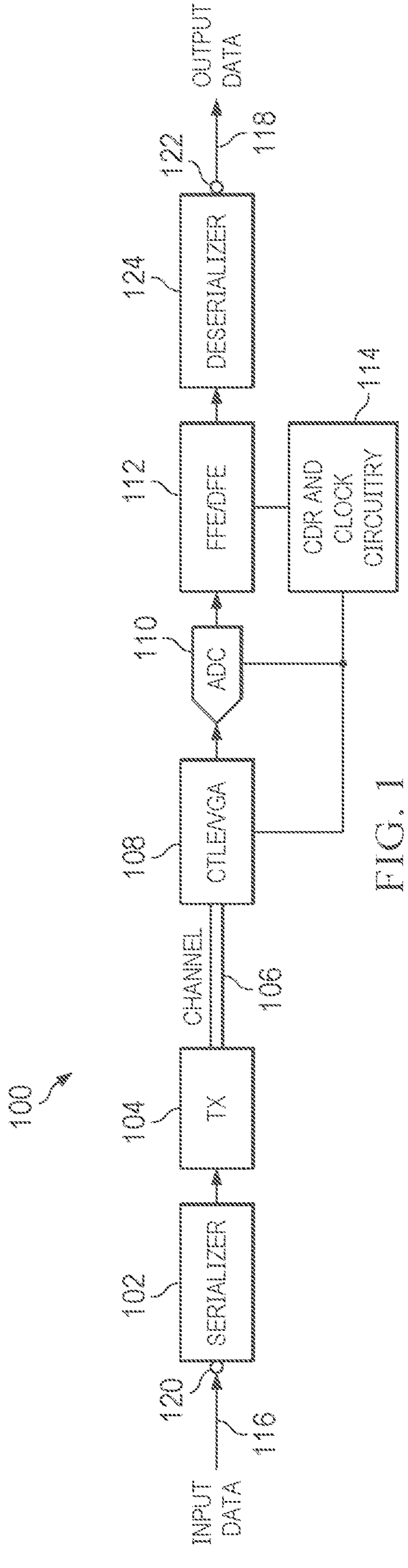
FIG. 1 is a block diagram of an example serializer/deserializer.

Clock and data recovery (CDR) circuitry at a receiver is useful for generating a clock signal based on the incoming data. The CDR circuitry recovers timing information from the incoming signal and re-times the received data. The data may also drift over time from its source, and that drift is tracked for correction. A programmable delay cell is useful for aligning the clock and data. However, in some systems the delay cell has to cover a large range like 1 microsecond (ms) to 100 femtoseconds (fs), and this range may involve a large amount of hardware. Also, with high data rates, interleaved sampling is useful. Interleaved sampling uses multiple analog-to-digital converters (ADCs) to sample the same input waveform, but at different relative phases. Hardware then interleaves these samples to create the waveform as if only one ADC were sampling the waveform at a higher sample rate. For a 112 gigabits per second (GBPS) rate, 8 phases of a 14 gigahertz (GHz) clock may be sampled. The jitter tolerance specification may require tracking large delays, which requires large area and power. For a bit error rate (BER) of 1e-10, the incoming data is sampled and the error may need to be as low as 100 femtoseconds (fs) to accurately sample.

In one system, a phase-locked loop (PLL) has a voltage-controlled oscillator (VCO), and a CDR loop controls the PLL phase. The output of the PLL has delay cells and phase interpolators (PI) to generate the interleaved sampling clocks. Delay cells and PIs at the output may have large power and area. In a second system, a ring oscillator (RO) is used instead of a VCO. The RO's architecture provides multiple phases. However, the PLL in this system uses a large power and area to meet noise specifications, and the PI is still used which increases power consumption. In a third system, the RO is injection locked, so no PLL is used. However, a PI at the output is used, which increases power consumption.

In examples herein, an injection-locked oscillator (e.g., an RO) has a delay control implemented on the injection clock path, rather than at the output of the oscillator. Delaying the injection clock delays all the output phases of a multi-phase oscillator. Therefore, PI is not used at the output. Injection locking acts to low-pass filter the input phase, which relaxes the noise and power requirements because the delay cell is now on the injection path.

In one example, the incoming data is provided to a CDR loop. Delay circuitry (e.g., a delay cell) measures the error between the data and the clock. That measured error is used to generate the injection clock provided to the input of the RO. The input is low-pass filtered, so noise at the output is reduced and a PI at the output is not used. In an example, if the bandwidth of the injection clock is 500 megahertz (MHz), noise higher in frequency than 500 MHz is suppressed and does not appear at the output of the RO. This features reduces the specifications for the delay cell, and reduces the area and power used by the system.

In some examples, the delay circuitry provides a delay range of about 10 nanoseconds (ns) with an accuracy of 100 fs. The delay is provided to each output of the RO by the delay circuitry. If the injection clock is delayed by delay circuitry, then all phases at the output of the RO are delayed as well. For example, if the injection clock moves 100 fs, all phases of the RO move by 100 fs. Therefore, only one delay cell or delay circuit is used in this example, rather than a delay circuit for each output of the RO. The injection clock also improves the low pass behavior, which reduces the low frequency phase noise of the RO. Also, the delay circuit provides a smaller range of delay compared to other systems, which reduces power and area. Large delays may be represented by changing the phase of the RO that the injection clock is provided to, and using a smaller range for the delay circuit.

The examples described herein produce the range of the delay for any application, from microseconds down to picoseconds. The delay may be injected on any phase of the output clock. If the RO has a period T, and there are eight output phases in an example, each phase has a period of T/8. The delay circuit only has to provide a delay of T/8. If T is 70 ps, T/8 is 8.5 ps, so a delay range of ±8.5 ps may allow any delay to be synthesized. For example, the point of injection can be changed (e.g., from phase 1 to phase N), to synthesize any delay.

FIG. 1 is a block diagram of an example serializer/deserializer system 100. On a transmitter side, system 100 includes a serializer 102 and transmitter 104. A channel 106 connects the transmitter side and a receiver side. The receiver side includes a continuous time linear equalization filter (CTLE)/variable gain amplifier (VGA) 108, an ADC 110, a feed-forward equalizer (FFE)/decision feedback equalizer (DFE) 112, CDR and clock circuitry 114, and a deserializer 124. System 100 has an input terminal 120 and an output terminal 122. System 100 also receives input data 116 at the input terminal 120 and provides output data 118 at the output terminal 122.

Serializer 102 has an input terminal 120 that receives input data 116 and an output coupled to an input of transmitter 104. Transmitter 104 has an output coupled to channel 106. CTLE/VGA 108 has an input coupled to channel 106 and an input coupled to an output of CDR and clock circuitry 114. CTLE/VGA 108 has an output coupled to an input of ADC 110. ADC 110 has another input coupled to the output of CDR and clock circuitry 114 and an output coupled to an input of FFE/DFE 112. FFE/DFE 112 has an output coupled to an input of CDR and clock circuitry 114 and an output coupled to an input of deserializer 124. Deserializer 124 has an output terminal 122 that provides output data 118.

In one example, serializer 102 receives input data 116 at input terminal 120 and provides serialized data at its output to the input of transmitter 104. Transmitter 104 transmits serialized data across channel 106. CTLE/VGA 108 receives the serialized data from channel 106. CTLE/VGA 108 equalizes and amplifies the incoming input signal. ADC 110 receives the data from CTLE/VGA 108 and performs an analog-to-digital conversion. ADC 110 provides data to FFE/DFE 112. FFE/DFE 112 provides feed forward equalization and decision feedback equalization of the data. FFE/DFE 112 has an output that provides data to deserializer 124, and an output that provides data to the input of CDR and clock circuitry 114. Deserializer 124 provides deserialized output data 118 at output terminal 122. CDR and clock circuitry 114 provides clock and data recovery. As described in examples herein, CDR and clock circuitry 114 provides N phase outputs from a multi-phase oscillator. CDR and clock circuitry 114 provides data and clock signals to CTLE/VGA 108 and ADC 110.

In examples herein, CDR and clock circuitry 114 includes an injection-locked oscillator (e.g., an RO) with a delay control implemented on an injection clock path, rather than at the output of the oscillator. An injection-locked oscillator receives a periodic clock signal at its input (e.g., an injection clock signal or injection clock, on an injection clock path) that locks the oscillator to the phase and/or frequency of the injection clock signal. The injection clock is useful for changing the phase and/or frequency of the clock signals produced by the oscillator. Delaying an injection clock delays all the output phases of the multi-phase oscillator. CDR and clock circuitry 114 is described below with respect to FIG. 2.

Figure 2:
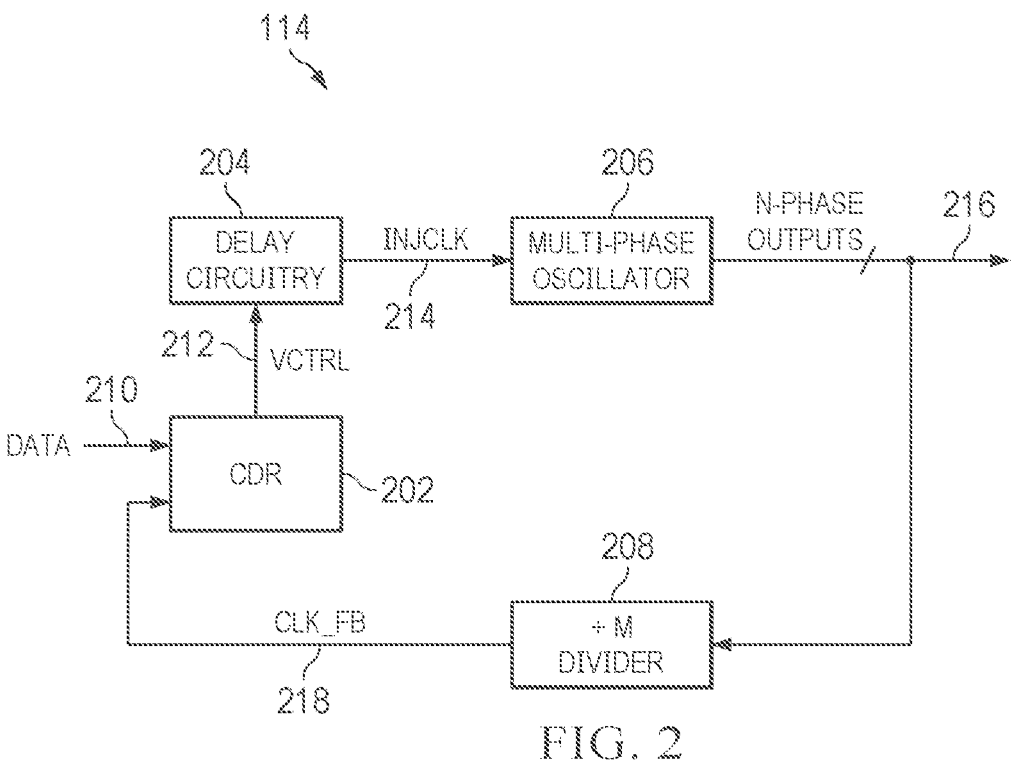
FIG. 2 is a block diagram of example CDR and clock circuitry.

FIG. 2 is a block diagram of example CDR and clock circuitry 114. CDR and clock circuitry 114 includes CDR 202, delay circuitry 204 (e.g., a delay circuit), multi-phase oscillator 206, and M divider 208. FIG. 2 also shows input data 210, VCTRL 212 (a voltage control signal), INJCLK 214 (injection clock or injection input signal), N-phase outputs 216, and CLK-FB 218 (clock feedback). The components in FIG. 2 are referred to as a CDR loop in some examples.

CDR 202 has a first input that receives input data 210 and a second input that receives CLK-FB 218. CDR 202 has an output coupled to an input of delay circuitry 204, in which the output provides VCTRL 212 to the input (referred to as a voltage control input) of delay circuitry 204. Delay circuitry 204 has an output coupled to an input of multi-phase oscillator 206, and delay circuitry 204 provides INJCLK 214 to the input of multi-phase oscillator 206. Multi-phase oscillator 206 has an output that provides N-phase outputs 216. In an example, the N-phase outputs 216 are clock signals provided to other components in a receiver for processing the received data. As shown in FIG. 1, clock signals are provided to CTLE/VGA 108, ADC 110, and FFE/DFE 112. Clock signals may also be provided to other components of a receiver. Example clock signals of a multi-phase oscillator are described below with respect to FIG. 3. One of the N-phase outputs 216 is provided to an input of M divider 208. M divider 208 has an output coupled to an input of CDR 202, and M divider 208 provides CLK-FB 218 to an input of CDR 202. M divider 208 receives an input clock signal from multi-phase oscillator 206 at a frequency $F_1$ and produces the output signal CLK-FB 218 at a frequency $F_2$. CLK-FB 218 is a feedback signal provided to CDR 202 to compare the N-phase outputs 216 to the incoming input data 210 and adjust INJCLK 214 as described herein.

In operation, input data 210 is provided to CDR 202. CDR 202 performs clock and data recovery operations using any suitable hardware, logic, or software. CDR 202 provides a control voltage VCTRL 212 to delay circuitry 204. VCTRL 212 controls the amount of delay produced by delay circuitry 204. CDR 202 produces VCTRL 212 based on the difference between input data 210 and CLK-FB 218. A larger difference between these two signals results in a larger VCTRL 212, which produces a larger delay from delay circuitry 204. Delay circuitry 204 receives VCTRL 212, which represents a measure of the error that is present between input data 210 and CLK-FB 218. That error is used by delay circuitry 204 to generate INJCLK 214, which is provided to multi-phase oscillator 206. INJCLK 214 locks the multi-phase oscillator 206 to a desired frequency. In examples herein, injection locking provides the advantage of phase filtering. Because injection locking provides phase filtering, phase interpolators at the output are not used for low pass filtering. The lack of these phase interpolators reduces power and area in some examples herein.

Figure 3:
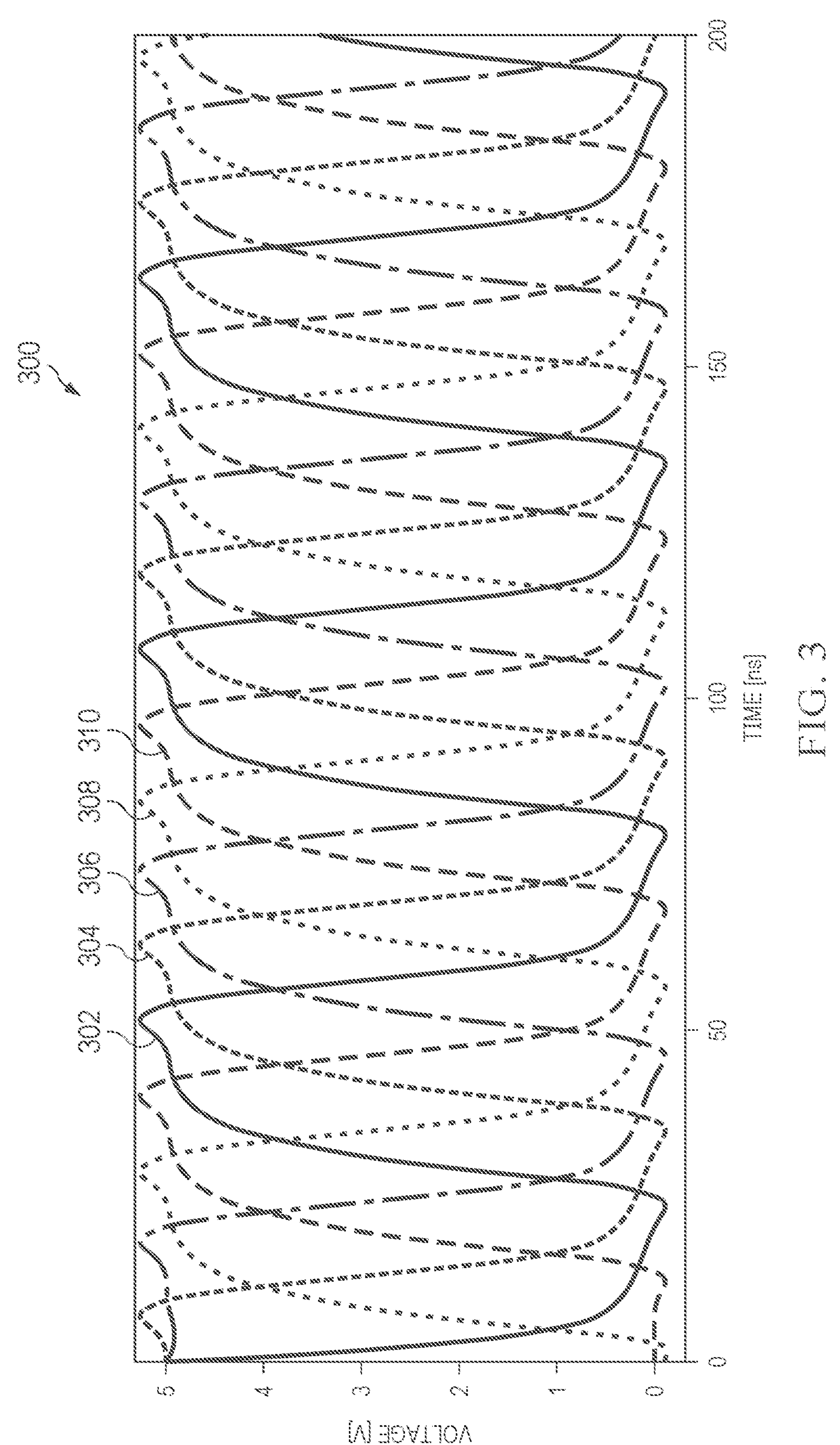
FIG. 3 is a graph of output phases of an example multi-phase ring oscillator.

FIG. 3 is a graph 300 of waveforms of outputs of an example RO. An RO produces an output signal at each stage or phase, where the number of phases N is 5 in this example. The output signals are roughly evenly spaced in phase. The frequency of the RO is a function of the number of stages and the delay time of the inverters in each stage. The oscillation frequency in an RO may be set by changing the delay time or the number of stages.

In graph 300, the y-axis represents the voltage of the output signal of the RO, and the x-axis represents time. In graph 300, the example RO produces five phases. The waveforms 302, 304, 306, 308, and 310 represent the five phases. In examples herein, the INJCLK 214 may be provided to any phase of multi-phase oscillator 206. If a large correction of the VCTRL 212 value is indicated, delay circuitry 204 may switch to providing INJCLK 214 to a different phase of the multi-phase oscillator 206. Calibration operations may also be performed as described below. Calibration determines the delay between any two adjacent phases of the multi-phase oscillator. For example, calibration may be performed to determine the delay between waveform 302 and waveform 304. This delay may be stored and used as described below to indicate when to switch to providing INJCLK 214 to a different phase of the multi-phase oscillator 206.

Figure 4:
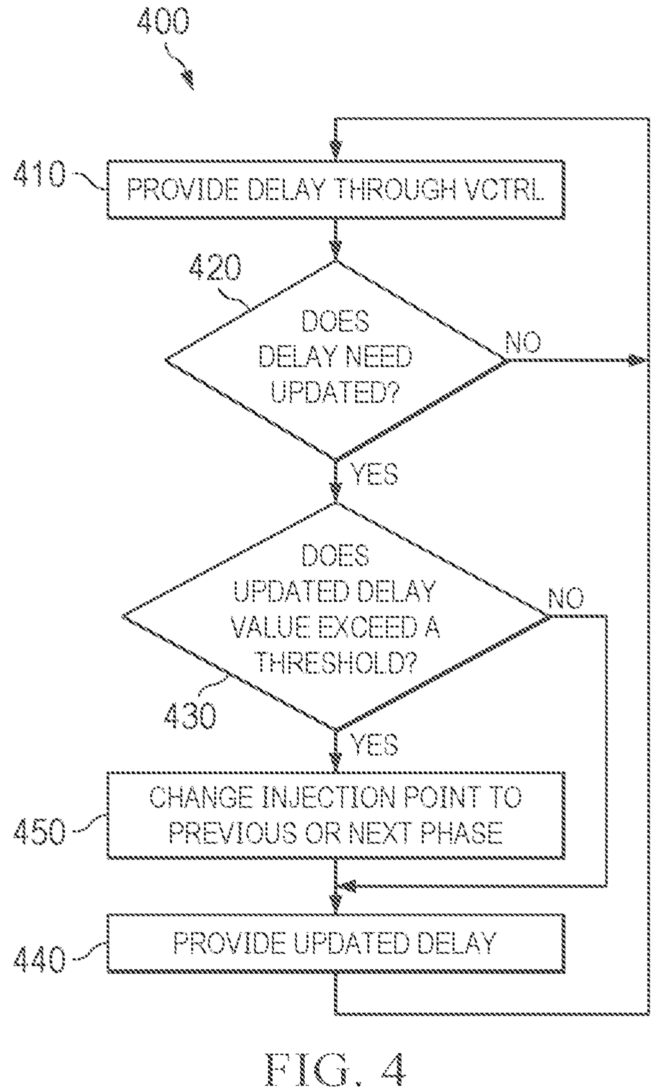
FIG. 4 is a flow diagram of an example method for updating the delay provided by delay circuitry.
Figure 5:
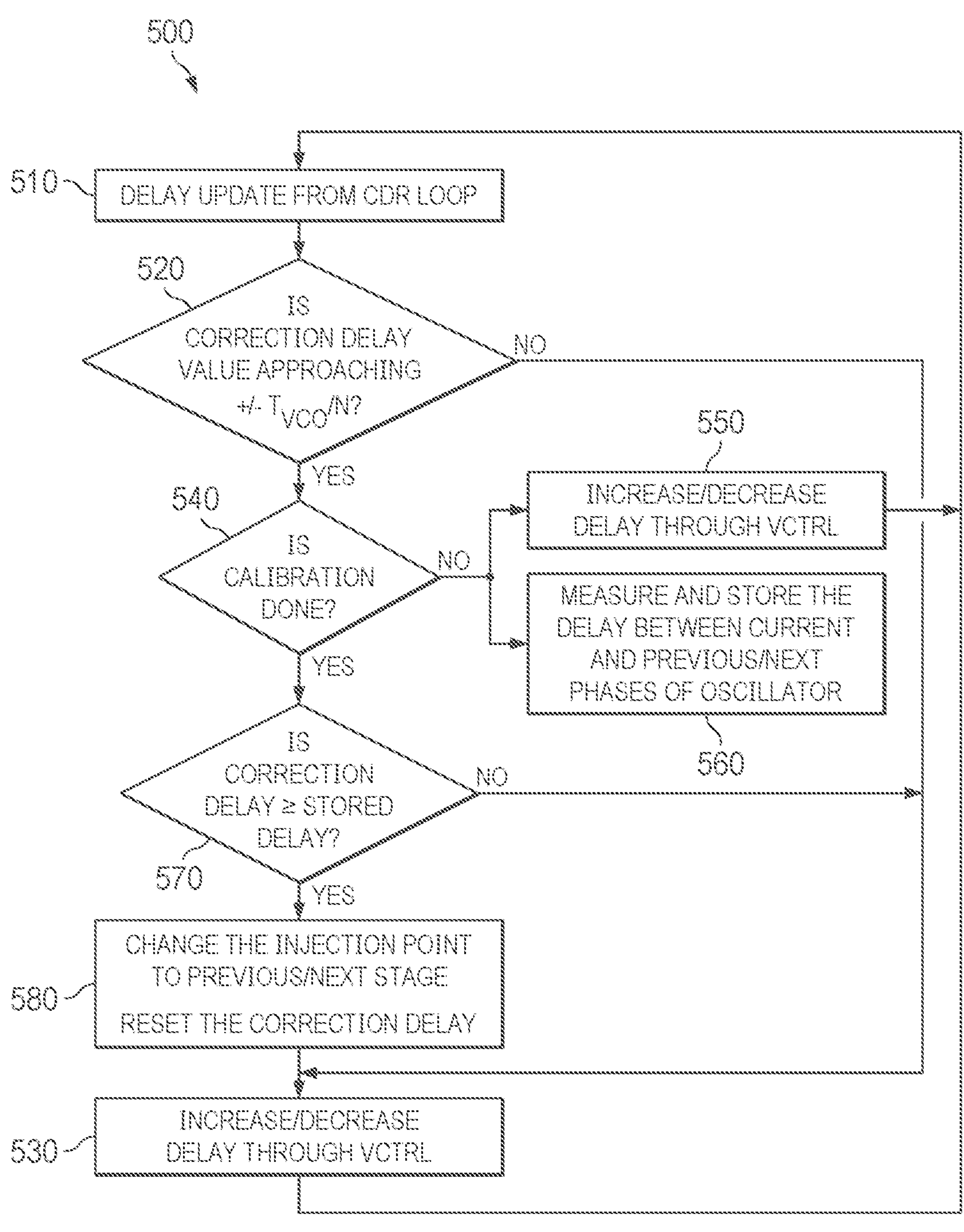
FIG. 5 is a flow diagram of an example method for updating the delay provided by delay circuitry.

FIG. 4 is a flow diagram of an example method 400 for updating the delay provided by delay circuitry 204. The operations of method 400 may be performed in any suitable order. The hardware components described above with respect to FIGS. 1-2 and below with respect to FIGS. 6 and 9-10 may perform method 400, in some examples. Any suitable hardware, software, or digital logic may perform method 400, in some examples. Method 400 describes a simplified delay update process where a calibration is not performed. FIG. 5, described below, includes a delay update process where a calibration is performed.

Method 400 begins at 410, where a delay is indicated through the provided VCTRL 212 signal. Delay circuitry 204 receives VCTRL 212 from CDR 202 and, responsive to and/or based on VCTRL 212, provides a delay to multi-phase oscillator 206 via INJCLK 214. The magnitude of VCTRL 212, and therefore the magnitude of the delay, is determined by the difference between input data 210 and CLK-FB 218.

Method 400 continues at 420, where CDR 202 determines if the delay is to be updated. If input data 210 and CLK-FB 218 are within an acceptable (e.g., programmed) first threshold of one another, no update is performed, and the method proceeds back to 410. If CDR 202 determines that input data 210 and CLK-FB 218 have drifted apart and the difference is to be corrected (e.g., are not within the acceptable first threshold), method 400 proceeds to 430.

At 430, method 400 determines if the magnitude of the updated delay value exceeds a second threshold. CDR 202 may make this determination, using control logic, code, or software as described below. This second threshold concerns the magnitude of the updated delay value, and whether the magnitude of the updated delay value approaches the value of the RO period (T) divided by the number of phases (N). For example, if the RO clock period is $T_{VCO}$, and the RO has 8 phases, the second threshold is a magnitude of the updated delay value near or at $T_{VCO}/N$, or $T_{VCO}/8$. The second threshold may be set at the value of $T_{VCO}/N$, or it may be set at a value close to but less than $T_{VCO}/N$, such as 70% or 90% of $T_{VCO}/N$. The second threshold value and its use for calibration is described below with respect to FIG. 5. In method 400, the second threshold determines if the injection point is changed to a different phase of multi-phase oscillator 206, or if the delay value is instead updated and provided to the current phase of multi-phase oscillator 206. If the updated delay value exceeds the second threshold, the injection point is changed to a different phase. If the updated delay value does not exceed the second threshold, the delay value is updated without changing the injection point.

At 430, if the updated delay value does not exceed the second threshold (e.g., $T_{VCO}/N$, 70% of $T_{VCO}/N$, etc.), then the method proceeds to 440. At 440, the updated delay value is indicated to delay circuitry 204 via VCTRL 212. CDR 202 provides the updated delay value via VCTRL 212. Delay circuitry 204 updates the value of the delay, and the new delay value is provided to multi-phase oscillator 206. Method 400 continues to 410 where the CDR loop continues to update the delay if needed.

At 430, if the updated delay value exceeds the second threshold (such as $T_{VCO}/N$), method 400 proceeds to 450. At 450, the injection point of the INJCLK 214 is changed to a previous or next phase of multi-phase oscillator 206. The previous or next phase is chosen based on the direction of the change in the delay. As an example, the injection clock may be provided to waveform 304 in FIG. 3. If the delay value exceeds the second threshold and the injection point is changed to the next phase, the injection clock is switched to waveform 306, which is a different phase of the multi-phase oscillator 206. If the delay value exceeds the second threshold and the injection point is changed to the previous phase, the injection clock is switched to waveform 302. Therefore, if large changes in the delay value are needed that exceed a second threshold (such as $T_{VCO}/N$), the phase of the injection clock may be switched. At 450, the correction delay may be reset to zero, for example if the injection clock was changed to a previous or next phase of multi-phase oscillator 206.

After 450, or after a "NO" result at 430, method 400 proceeds to 440. The updated delay is provided by CDR 202 to delay circuitry 204 (which may be zero delay in some examples). Then, method 400 continues to 410, where the difference between input data 210 and CLK-FB 218 is determined. Further updates to the delay value may be performed if input data 210 and CLK-FB 218 have drifted apart and the difference is to be corrected.

FIG. 5 is a flow diagram of an example method 500 for updating the delay provided by delay circuitry 204. The operations of method 500 may be performed in any suitable order. The hardware components described above with respect to FIGS. 1-2 and below with respect to FIGS. 6 and 9-10 may perform method 500, in some examples. Any suitable hardware, software, or digital logic may perform method 500, in some examples.

Method 500 begins at 510, where a delay update is provided from CDR 202. CDR 202 determines the value of the delay update (e.g., the correction delay value) based on the difference between input data 210 and CLK-FB 218. In this example, CDR 202 determines to update the delay at 510.

Method 500 proceeds to 520, where control logic (e.g., 604 of FIGS. 6, 9, and 10) determines if the correction delay value exceeds the second threshold, such as $T_{VCO}/N$. As described above, the second threshold could be a value less than $T_{VCO}/N$, such as 70% of $T_{VCO}/N$. If the correction delay value exceeds the second threshold, method 500 proceeds to 540. If the correction delay value does not exceed the second threshold, method 500 proceeds to 530. At 530, the CDR 202 increases or decreases the delay through VCTRL 212. After the VCTRL 212 value is updated, method 500 proceeds back to 510.

At 520, if the correction delay value exceeds the second threshold, method 500 proceeds to 540. At 540, control logic determines if a calibration has been performed. In no calibration has been performed, method 500 proceeds to 550.

At 550, CDR 202 increases or decreases the delay through VCTRL 212. After the VCTRL 212 value is updated, method 500 proceeds back to 510. Also, if no calibration has been performed, method 500 proceeds from 540 to 560. At 560, calibration circuitry (described below) measures and stores the delay between the current phase of the multi-phase oscillator 206 and the previous and next phases of the multi-phase oscillator 206. The delays may be stored in a memory or any suitable storage. The calibration is performed to determine the delay difference between the various phases of the multi-phase oscillator 206. These differences are useful for determining when to switch the injection clock to a different phase, or when to just update the delay value and not switch the injection clock.

At 540, control logic determines if a calibration has been performed. If a calibration has been performed, method 500 proceeds to 570. At 570, control logic determines if the correction delay value is greater than the stored delay. The stored delays are stored as a result of the calibration process performed in 560, described above. The stored delay represents the phase delay between phases of the multi-phase oscillator 206. If the correction value is not greater than the stored delay, method 500 proceeds to 530, where CDR 202 increases or decreases the delay through VCTRL 212. After the VCTRL 212 value is updated, method 500 proceeds back to 510.

At 570, if the control logic determines that the correction value is greater than the stored delay, method 500 proceeds to 580. If the correction value is greater than the stored delay, that means the correction value would push the delay to the next or previous phase of the multi-phase oscillator 206. Rather than implementing a large delay that extends into another phase of the multi-phase oscillator 206, the method 500 changes the injection point to the next or previous stage at 580. At 580, the control logic also resets the correction delay. After the injection point is changed to an adjacent stage at 580, method 500 proceeds to 530. At 530, CDR 202 increases or decreases the delay through VCTRL 212 if needed, and the CDR loop proceeds with the injection point provided to a different stage of the multi-phase oscillator 206.

Figure 6:
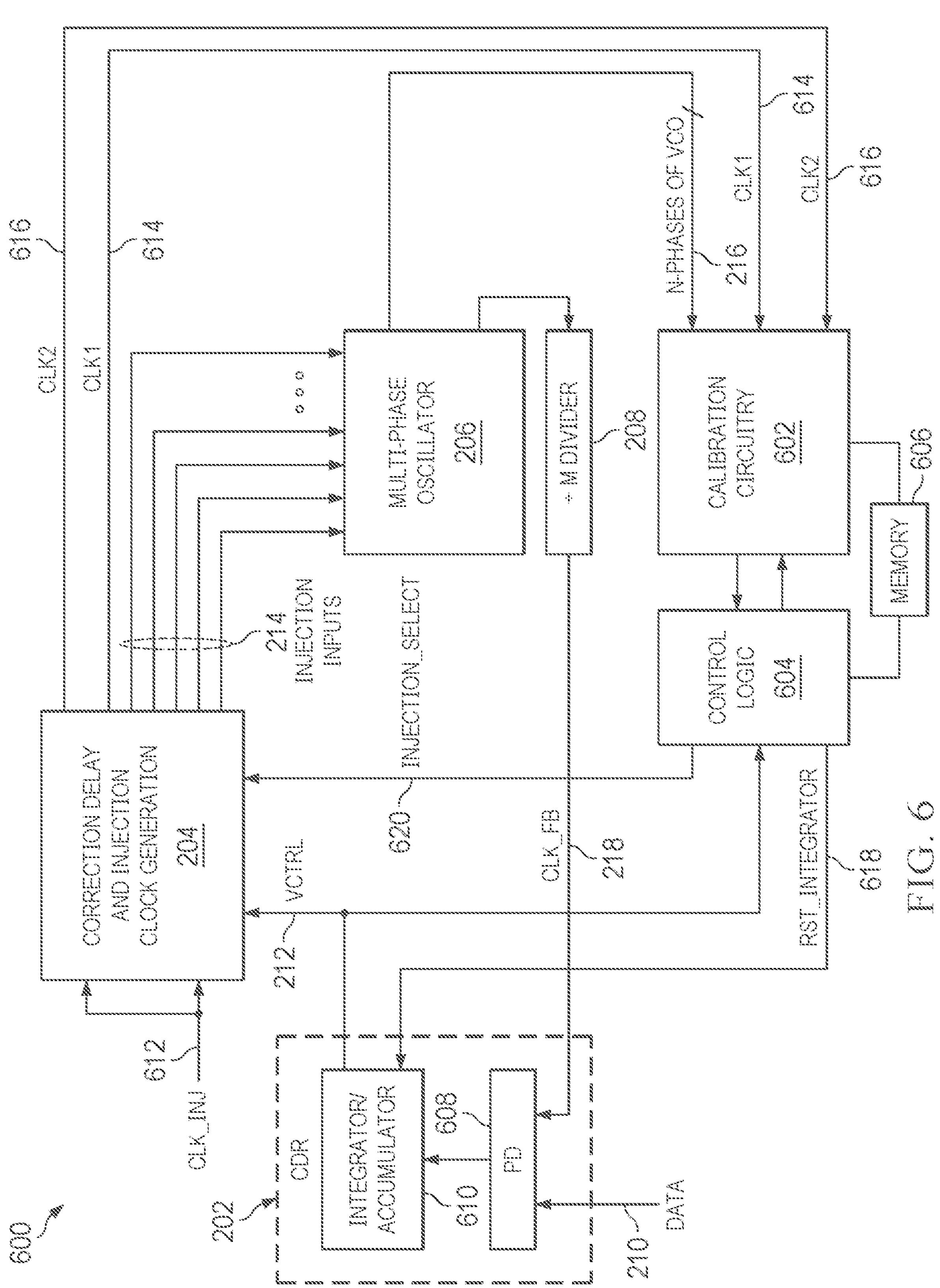
FIG. 6 is a block diagram of an example system for clock and data recovery.

FIG. 6 is a block diagram of an example system 600 for clock and data recovery. System 600 includes some of the components described above with respect to FIG. 2, and like numerals denote like components. The components in FIG. 6 may be referred to as a CDR loop in some examples herein.

System 600 includes CDR 202, delay circuitry 204 (which provides correction delay and injection clock generation), multi-phase oscillator 206, and M divider 208. Also shown is input data 210, VCTRL 212, INJCLK 214 (shown as multiple injection input signals in FIG. 6), N-phase outputs 216, and CLK-FB 218. These components are coupled together and operate as described above with respect to FIG. 2. System 600 includes the components of the CDR loop shown in FIG. 2, along with additional components for calibration and control of the CDR loop.

System 600 also includes calibration circuitry 602, control logic 604, and memory 606. CDR 202 includes phase detector (PD) 608 and integrator/accumulator 610. Calibration circuitry 602 includes multiple inputs that receive clock signals and signals from multi-phase oscillator 206. Calibration circuitry 602 is coupled to, and communicates with, control logic 604 and memory 606. Control logic 604 is coupled to calibration circuitry 602, memory 606, CDR 202, and delay circuitry 204. Phase detector 608 has inputs that receive input data 210 and CLK_FB 218. Phase detector 608 has an output coupled to an input of integrator/accumulator 610. Also shown is CLK_INJ 612, CLK1 614, CLK2 616, RST_INTEGRATOR signal 618 (integrator reset), and INJECTION_SELECT signal 620. Integrator 610 has an input that receives RST_INTEGRATOR signal 618, and an output that provides VCTRL 212 to delay circuitry 204 and control logic 604.

In one example, calibration circuitry 602 includes inputs that receive the N-phase outputs 216, and the CLK1 614 and CLK2 616 signals. CLK1 614 is a delayed clock signal provided by delay circuitry 204, and CLK2 616 is an un-delayed clock signal provided by delay circuitry 204. CLK1 614 has a known delay compared to CLK2 616, which is used for calibration as described below. Calibration circuitry 602 is coupled to control logic 604 and memory 606. Control logic 604 may be stored in memory 606 in one example. Control logic 604 may be computer code, software, or instructions in an example, executed by a processor or controller (not shown in FIG. 6). In other examples, control logic 604 may be programmable logic or digital logic. Calibration circuitry 602 and control logic 604 interact with one another to perform various functions, as described herein. Also, shown is RST_INTEGRATOR signal 618, which is provided by control logic 604 to integrator/accumulator 610 to reset the integrator/accumulator 610. Also shown is INJECTION_SELECT signal 620, which is provided to delay circuitry 204 by control logic 604 to change the injection clock phase of the multi-phase oscillator 206, as described herein. Control logic 604 also receives VCTRL 212 from CDR 202 at an input, which control logic 604 uses to compare to a stored delay value as described below.

In an example operation, PD 608 and integrator/accumulator 610 compare input data 210 and CLK_FB 218 to produce an error between the two signals. This error is integrated to produce VCTRL 212, which changes the delay of the injection clock CLK_INJ 612 within delay circuitry 204. Injection clock CLK_INJ 612 may be provided by CDR 202 on an injection clock path (e.g., the path at the input of delay circuitry 204 that provides CLK_INJ 612 to delay circuitry 204). VCTRL 212 is a signal provided by CDR 202 to delay circuitry 204 to indicate the amount of delay to be produced by delay circuitry 204, in order to align the output signals of multi-phase oscillator 206. Delay circuitry 204 also receives an injection clock signal CLK_INJ 612, which is used to lock the multi-phase oscillator 206 to the phase and/or frequency of the injection clock signal CLK_INJ 612. Delay circuitry 204 receives both CLK_INJ 612 and VCTRL 212, and uses those signals to generate the injection inputs (INJCLK) 214 that are provided to each phase of multi-phase oscillator 206. INJCLK 214 are clock signals at a certain frequency (set by CLK_INJ 612) and with a certain delay (set by VCTRL 212) provided by delay circuitry 204 to a selected phase of multi-phase oscillator 206. The INJCLK 214 signal may be injected on any of the phases, and is only injected on one phase in an example. Multiple inputs to multi-phase oscillator 206 for receiving the INJCLK 214 signal are shown in FIG. 6, to indicate that the INJCLK 214 signal may be provided to any phase of multi-phase oscillator 206. The injection is applied to any phase of the multi-phase oscillator 206 based on the INJECTION_SELECT signal 620 from control logic 604. The selected phase that receives the INJCLK 214 signal is M divided and fed back to CDR 202.

In an example operation, the phase that is receiving the injection from delay circuitry 204 is compared to an adjacent phase. The N phases of the multi-phase oscillator 206 are provided to calibration circuitry 602, where calibration circuitry 602 measures the delay between the two phases. The injection point can be moved forward or backward to a different phase, depending on the size and direction of the delay. CLK2 616 may be un-delayed, and CLK1 614 may be delayed by the VCTRL 212 input, which provides a measurement of how much the VCTRL 212 delay is. If the correction delay is as large as the stored delay, the control logic 604 increments or decrements the INJECTION_SELECT signal 620 and resets VCTRL 212 with RST_INTEGRATOR signal 618. The INJECTION_SELECT signal 620 moves the injection point to a different phase of the multi-phase oscillator 206. The CDR loop may then continue to monitor and adjust the delay as needed, or change the injection phase, with the components described in FIGS. 2 and 6 herein. Additional description of calibration circuitry 602 and control logic 604 is provided below.

Figure 7:
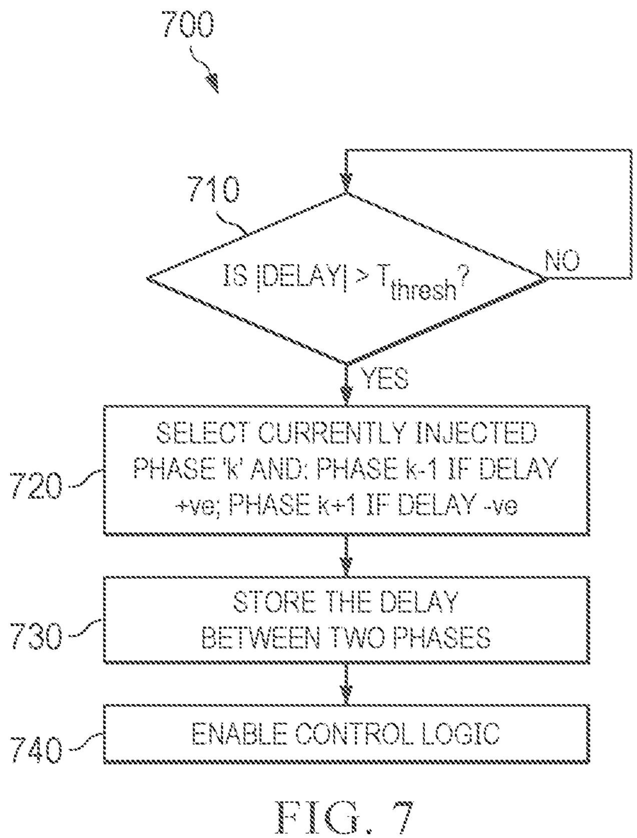
FIG. 7 is a flow diagram of an example method for performing a calibration.

FIG. 7 is a flow diagram of an example method 700 for performing a calibration. The operations of method 700 may be performed in any suitable order. Calibration circuitry 602 may perform method 700, in some examples. Any suitable hardware, software, or digital logic may perform method 700, in some examples.

Method 700 begins at 710, where the magnitude of the delay from delay circuitry 204 is compared to a threshold $T_{thresh}$. $T_{thresh}$ is the threshold described above with respect to operation 520. As described above, the threshold $T_{thresh}$ could be a value less than $T_{VCO}/N$, such as 70% of $T_{VCO}/N$. If the absolute value of the correction delay value does not exceed the threshold $T_{thresh}$, method 700 remains at 710. If the absolute value of the correction delay value exceeds the threshold $T_{thresh}$, method 700 proceeds to 720.

At 720, calibration circuitry 602 selects the currently injected phase k of the multi-phase oscillator 206. Calibration circuitry 602 also selects the adjacent phase (k+1 or k−1) depending on whether the correction delay value is positive or negative. Phases k and k−1 are selected if the delay is positive, and phases k and k+1 are selected if the delay is negative.

Method 700 then proceeds to 730, where calibration circuitry 602 measures and stores the delay between the two selected phases (k and k+1, or k and k−1). The delay is stored in memory 606, in one example. The delay is stored so that the delay may be compared to a future correction delay value to determine if the injection phase of the multi-phase oscillator 206 is to be changed. In one example, the delay is measured using a successive approximation register (SAR) loop.

Method 700 proceeds to 740, where control logic 604 is enabled and system 600 may operate as described herein. System 600 then continues to perform the operations of injection locking and providing a delay to the multi-phase oscillator 206, and adjusting the delay using calibration circuitry 602 and control logic 604.

Figure 8:
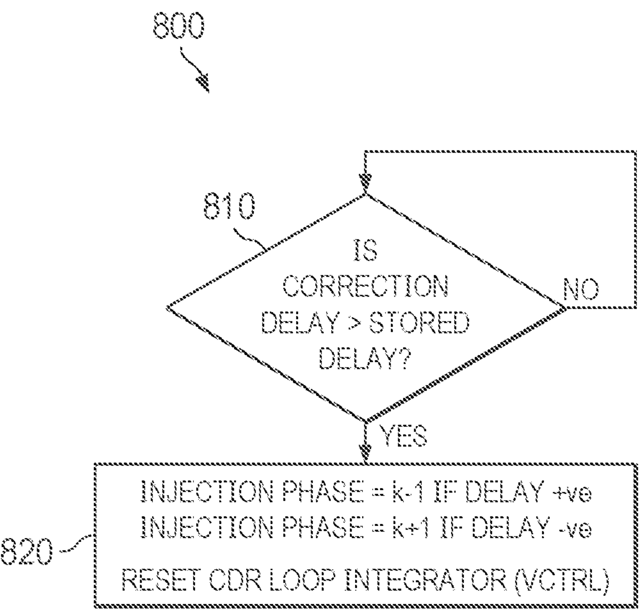
FIG. 8 is a flow diagram of an example method for adjusting an injection phase of a multi-phase oscillator.

FIG. 8 is a flow diagram of an example method 800 for adjusting an injection phase of a multi-phase oscillator 206. The operations of method 800 may be performed in any suitable order. Control logic 604 may perform method 800, in some examples. Any suitable hardware, software, or digital logic may perform method 800, in some examples.

Method 800 begins at 810, where control logic 604 compares the VCTRL-based correction delay to the stored delay determined by calibration circuitry 602. If the correction delay value is less than the stored delay value (e.g., the correction delay value is less than the difference between adjacent phases of the multi-phase oscillator 206), method 800 remains at 810. If the correction delay value is more than the stored delay value (e.g., the correction delay value is greater than the delay between adjacent phases), the method 800 proceeds to 820.

At 820, the injection point is moved to the previous phase (k−1) if the delay is positive. The injection point is moved to next phase (k+1) if the delay is negative (e.g., advancement). Also, control logic 604 provides the RST_INTEGRATOR signal 618 to CDR 202 to reset VCTRL 212 and set the delay to zero. The CDR loop, which includes the components described above with respect to FIGS. 2 and 6, then continues to monitor and correct the error using delay circuitry 204 and the other components in system 600.

Figure 9:
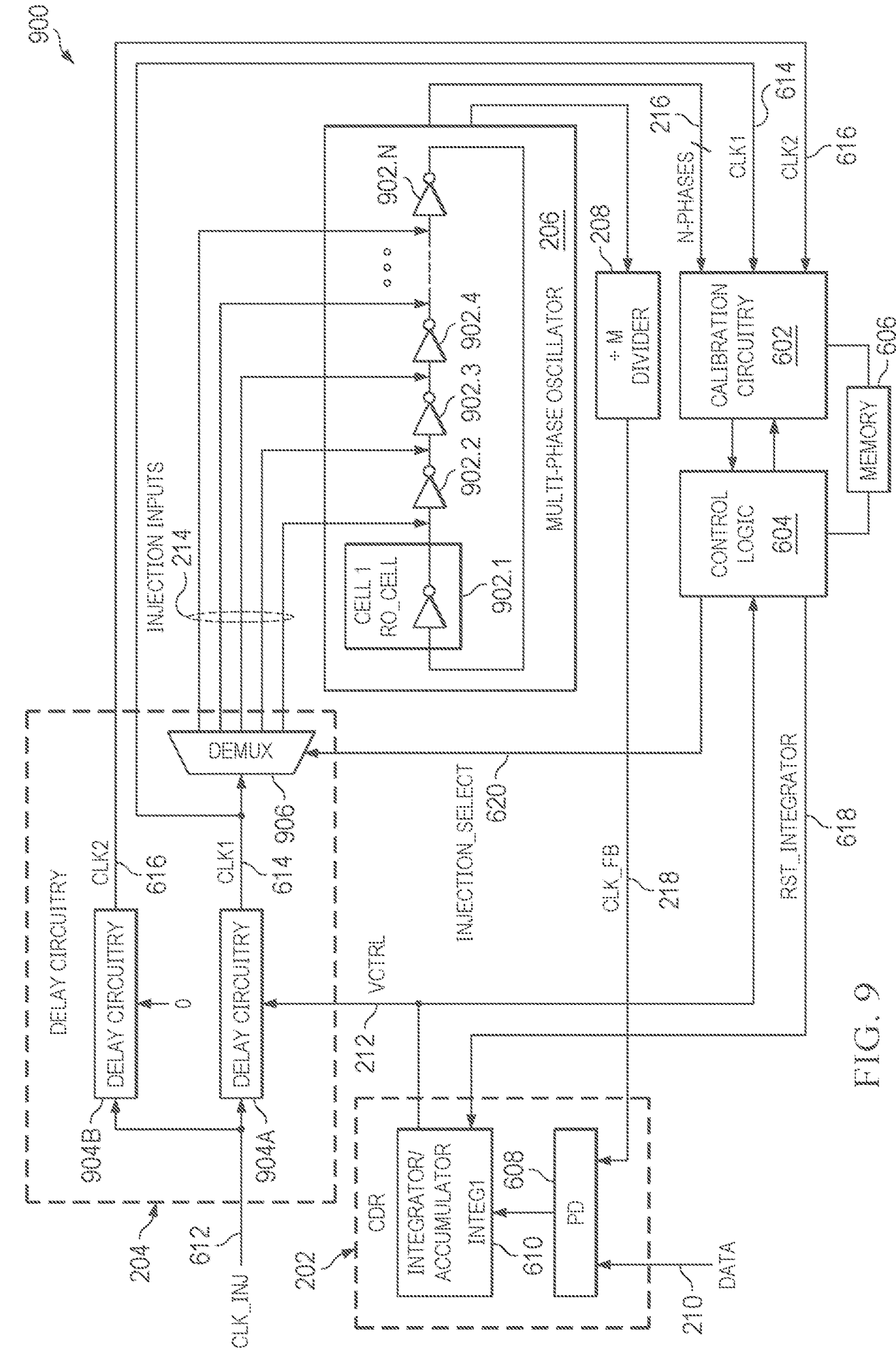
FIG. 9 is a block diagram of an example system for clock and data recovery.

FIG. 9 is a block diagram of an example system 900 for clock and data recovery. System 900 includes some of the components described above with respect to FIGS. 2 and 6, and like numerals denote like components.

System 900 includes CDR 202, delay circuitry 204 (which includes delay circuitry 904A and 904B), multi-phase oscillator 206, and M divider 208. Multi-phase oscillator 206 includes N delay cells 902.1, 902.2, . . . 902.N, also referred to as delay circuits. Also shown is input data 210, VCTRL 212, INJCLK 214 (shown as multiple injection inputs in FIG. 9), N-phase outputs 216, and CLK-FB 218. The components in FIG. 9 are coupled together and operate as described above with respect to FIG. 2.

System 900 also includes calibration circuitry 602, control logic 604, and memory 606. CDR 202 includes phase detector 608 and integrator/accumulator 610. Also shown is CLK_INJ 612, CLK1 614, CLK2 616, RST_INTEGRATOR signal 618 (integrator reset), and INJECTION_SELECT signal 620. These components are coupled together and operate as described above with respect to FIG. 6. System 900 also includes demultiplexer 906.

Delay cells 902.1, 902.2, . . . 902.N each have an input and an output, and are connected serially from 902.1 to 902.N. The output of delay cell 902.N is coupled to the input of delay cell 902.1. Each input of the delay cells 902.2 to 902.N is also coupled to an output of demultiplexer 906. Delay circuitry 904A has an input that receives CLK_INJ 612, and an input that receives VCTRL 212. Delay circuitry 904A has an output that provides CLK1 614 to demultiplexer 906 and to calibration circuitry 602. Delay circuitry 904B has an input that receives CLK_INJ 612, and an input that receives a 0 value as a delay signal. Delay circuitry 904B has an output that provides CLK2 616 to calibration circuitry 602. Because delay circuitry 904B receives a 0 value as a delay signal, CLK2 616 is an un-delayed signal that may be useful for control and calibration as described herein.

Demultiplexer 906 receives CLK1 614 at its input and provides a delay signal via injection inputs (INJCLK) 214 to each phase of multi-phase oscillator 206 via its multiple outputs. In system 900, multi-phase oscillator 206 is an RO with N delay cells 902. An injection input (INJCLK) 214 (e.g., the injection delay) is provided to each delay cell 902 via demultiplexer 906. Delay cells 902 may include any suitable circuitry or hardware to provide a delay.

In operation, the multi-phase oscillator 206 can be injection locked to any harmonic of CLK_INJ 612. In general, the frequency of multi-phase oscillator 206 ($f_{VCO}$) equals M times the frequency of CLK_INJ 612 (e.g., $f_{vco}=M*f_{inj}$). Multi-phase oscillator 206 has N inverter stages, and Td is the delay of each delay cell 902.

The injection clock CLK_INJ 612 is delayed by delay circuitry 904A to produce CLK1 614 based on VCTRL 212. CLK1 614 goes through demultiplexer 906, where INJECTION_SELECT signal 620 specifies which phase of the multi-phase oscillator 206 to apply the injection. The divided multi-phase oscillator 206 clock CLK_FB 218 is fed back to PD 608, which compares CLK_FB 218 to the incoming input data 210. The error determined by PD 608 is integrated by integrator/accumulator 610 to produce VCTRL 212.

Figure 10:
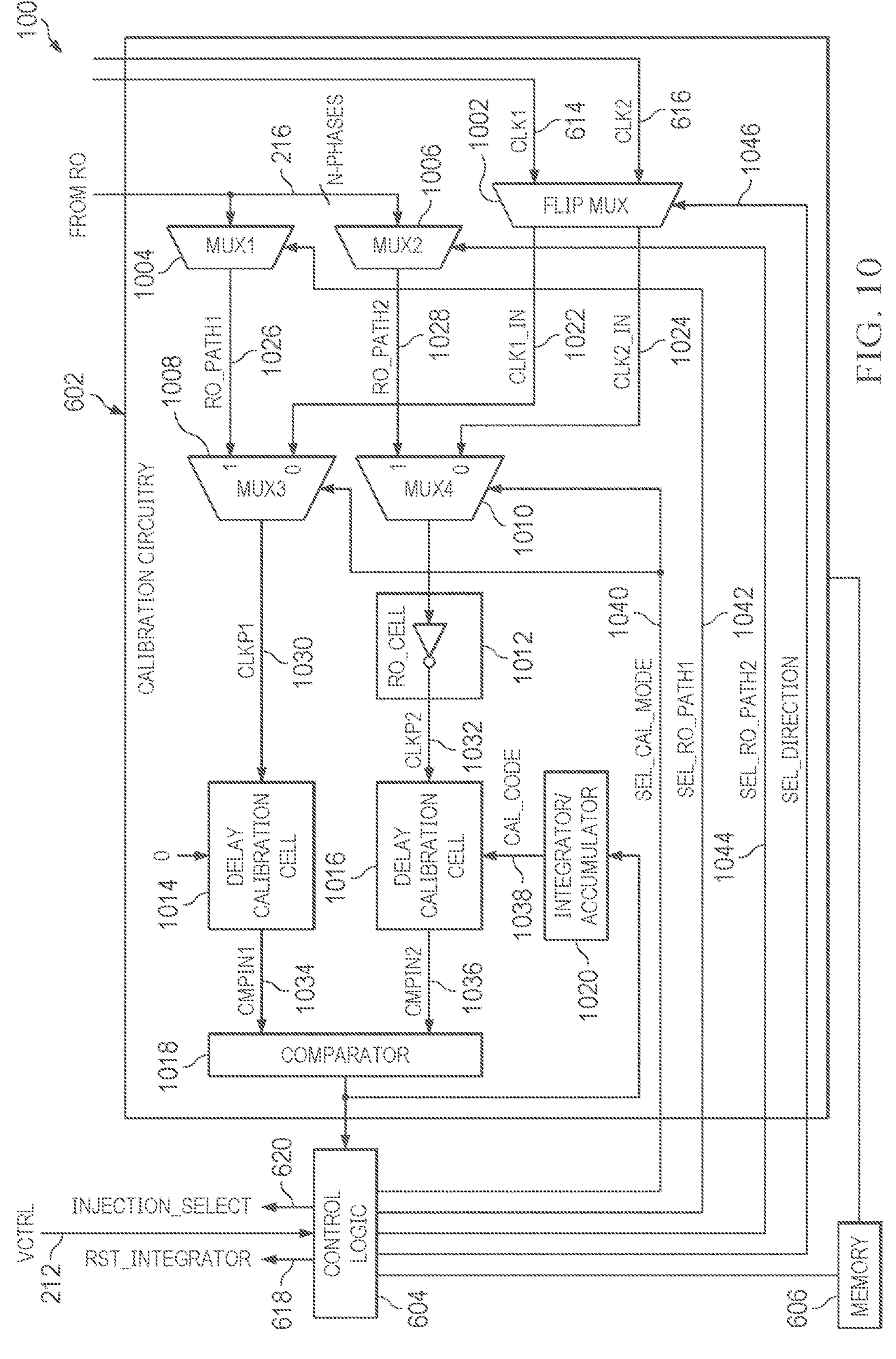
FIG. 10 is a block diagram of example calibration circuitry and control logic.

FIG. 10 is a block diagram of an example system 1000 with calibration circuitry 602, control logic 604, and memory 606. These components are coupled together and operate as described above. Also shown is VCTRL 212, N-phase outputs 216, CLK1 614, CLK2 616, RST_INTEGRATOR signal 618, and INJECTION_SELECT signal 620.

Calibration circuitry 602 includes flip multiplexer (FLIP MUX) 1002, multiplexer 1 (MUX1) 1004, multiplexer 2 (MUX2) 1006, multiplexer 3 (MUX3) 1008, and multiplexer 4 (MUX4) 1010. Calibration circuitry 602 includes delay cell 1012, delay calibration cell (or circuitry) 1014, delay calibration cell (or circuitry) 1016, comparator 1018, and integrator/accumulator 1020. Also shown are various signals, such as CLK1_IN 1022, CLK2_IN 1024, RO_PATH1 1026, RO_PATH2 1028, CLKP1 1030, CLKP2 1032, CMPIN1 1034, CMPIN2 1036, CAL_CODE 1038, SEL_CAL_MODE 1040, SEL_RO_PATH1 1042, SEL_RO_PATH2 1044, and SEL_DIRECTION 1046. The selection inputs for the multiplexers described herein may be coupled to a processor or controller (not shown in FIG. 10) or to hardware or digital logic (not shown in FIG. 10) configured to control the multiplexers and perform the operations as described herein. Control logic 604 may control the selection inputs for the multiplexers as described herein.

FLIP MUX 1002 has two inputs coupled to delay circuitry 204 (not shown in FIG. 10). FLIP MUX 1002 has two outputs, coupled to MUX3 1008 and MUX4 1010. FLIP MUX 1002 has a selection input controlled by control logic 604. MUX1 1004 has an input coupled to multi-phase oscillator 206 (not shown in FIG. 10), an output coupled to an input of MUX3 1008, and a selection input controlled by control logic 604. MUX2 1006 has an input coupled to multi-phase oscillator 206, an output coupled to an input of MUX4 1010, and a selection input controlled by control logic 604.

MUX3 1008 has two inputs coupled to the output of MUX1 1004 and to an output of FLIP MUX 1002. MUX3 1008 has an output coupled to an input of delay calibration cell 1014. MUX3 1008 has a selection input controlled by control logic 604. MUX4 1010 has two inputs coupled to the output of MUX2 1006 and to an output of FLIP MUX 1002. MUX4 1010 has an output coupled to an input of delay cell 1012. MUX4 1010 has a selection input controlled by control logic 604. Delay cell 1012 has an output coupled to delay calibration cell 1016.

Delay calibration cell 1014 has a second input that receives a 0 delay, and an output coupled to comparator 1018. Delay calibration cell 1016 has an input coupled to delay cell 1012 and an input coupled to integrator/accumulator 1020. Delay calibration cell 1016 has an output coupled to comparator 1018. Comparator 1018 has an output coupled to the input of integrator/accumulator 1020. Comparator 1018 also provides an output signal to control logic 604.

FLIP MUX 1002 has two inputs, a first input that receives CLK1 614 and a second input that receives CLK2 616. FLIP MUX 1002 has a selection input that receives SEL_DIRECTION 1046. FLIP MUX 1002 has a first output that provides CLK1_IN 1022 to an input of MUX3 1008, and a second output that provides CLK2_IN 1024 to an input of MUX4 1010.

MUX1 1004 has an input that receives N-phase outputs 216 and a selection input that receives SEL_RO_PATH1 1042 from control logic 604. MUX1 1004 has an output that provides RO_PATH1 1026 to an input of MUX3 1008. MUX2 1006 has an input that receives N-phase outputs 216 and a selection input that receives SEL_RO_PATH2 1044 from control logic 604. MUX2 1006 has an output that provides RO_PATH2 1028 to an input of MUX4 1010.

MUX3 1008 has an input coupled to an output of FLIP MUX 1002 and an input coupled to an output of MUX1 1004, as described above. MUX3 1008 has a selection input that receives SEL_CAL_MODE 1040 from control logic 604. MUX 3 1008 has an output that provides CLKP1 1030 to delay calibration cell 1014. MUX4 1010 has an input coupled to an output of FLIP MUX 1002 and an input coupled to an output of MUX2 1006, as described above. MUX4 1010 has a selection input that receives SEL_CAL_MODE 1040 from control logic 604. MUX 4 1010 has an output that provides a signal to delay cell 1012. Delay cell 1012 has an output that provides a signal CLKP2 1032 to delay calibration cell 1016.

Delay calibration cell 1014 receives a CLKP1 1030 signal from MUX3 1008 and a zero calibration input. Delay calibration cell 1014 provides an output signal CMPIN1 1034 to comparator 1018. Delay calibration cell 1016 receives a CLKP2 1032 signal from delay cell 1012 and a calibration input CAL_CODE 1038 from integrator/accumulator 1020. Delay calibration cell 1014 provides an output signal CMPIN2 1036 to comparator 1018. Comparator 1018 provides an output signal to control logic 604 and to integrator/accumulator 1020. Integrator/accumulator 1020 receives the output from comparator 1018 at its input and provides CAL_CODE 1038 at its output to delay calibration cell 1016.

Control logic 604 receives VCTRL 212 at a first input and a signal from comparator 1018 at a second input. Control logic 604 provides a number of signals, including RST_INTEGRATOR signal 618, INJECTION_SELECT signal 620, SEL_CAL_MODE 1040, SEL_RO_PATH1 1042, SEL_RO_PATH2 1044, and SEL_DIRECTION 1046.

In operation, calibration circuitry performs a calibration between two phases of multi-phase oscillator 206 as described herein. In one example, two phases from the multi-phase oscillator 206 are selected to be compared. In one example, the delay cell 1012 in calibration circuitry 602 is the same type of delay cell 902 found in multi-phase oscillator 206. If there is no mismatch (e.g., due to process, temperature, etc.), then the delays from delay cell 902 and delay cell 1012 are equal. After a calibration is performed, the delayed clock (CLK1 614) and the un-delayed clock (CLK2 616) are passed through the same path, using delay cell 1012 and the CAL_CODE 1038 from the calibration. The point at which comparator 1018 trips is the point that the delay on CLK1 614 (produced by VCTRL 212) compared to CLK2 616 (which has a zero delay) is exactly the same as the delay between the two selected phases of the multi-phase oscillator 206. In this example, two phases of the RO are selected and the advanced phase (e.g., the one of the selected phases that is ahead of the other selected phase) is delayed by using the delay cell 1012. The calibration circuitry 602 calibrates until the clocks are aligned, and then CLK1 614 and CLK2 616 are passed through the same paths. Because the same paths are used, no mismatch errors occur.

In a more detailed example, when the delay produced by delay circuitry 204 reaches a threshold that is near ±Td (the delay produced by a delay cell 902), the calibration circuitry 602 compares the current and previous/next phase of the multi-phase oscillator 206, depending on the polarity of the correction delay. The threshold is 90% of Td in one example, but other thresholds are useful in other examples, such as 80% or 95%. The delay is provided by the value of VCTRL 212, so CDR 202 may determine if the delay reaches the threshold by monitoring the value of VCTRL 212. The output signal provided by comparator 1018 is integrated by integrator/accumulator 1020 to produce CAL_CODE 1038, which indicates the information of the delay between two selected phases.

First, SEL_CAL_MODE 1040 is set to 1 by control logic 604. With SEL_CAL_MODE 1040 set to 1, MUX1 1004 and MUX2 1006 select the corresponding phases of multi-phase oscillator 206 to be calibrated. SEL_RO_PATH1 1042 and SEL_RO_PATH2 1044 codes are chosen by control logic 604 based on the error provided by PD 608 via VCTRL 212 to control logic 604. The codes are selected such that RO_PATH1 1026 is delayed with respect to RO_PATH2 1028.

Because the delay between subsequent phases is Td, delaying RO_PATH2 1028 by Td (using delay cell 1012) provides for CLKP1 1030 and CLKP2 1032 to be at approximately the same phase. The residual mismatch between the selected delay cells 902 (corresponding to the selected phases) is calibrated with delay calibration cell 1016. The range requirement for the delay calibration cell 1016 is reduced from Td to just the mismatch between the selected delay cells 902 in the multi-phase oscillator 206. The clocks CLKP1 1030 and CLKP2 1032 are compared using comparator 1018, and the integrator/accumulator 1020 changes the calibration code CAL_CODE 1038 by adjusting the integrated signal provided at the output of integrator/accumulator 1020.

After the calibration is complete, SEL_CAL_MODE 1040 is set to zero by control logic 604, and CLK1 614 and CLK2 616 are passed through the same path as the RO signals above (via selections by MUX3 1008 and MUX4 1010, and then through the path provided by delay cell 1012, delay calibration cell 1014, and delay calibration cell 1016). The CAL_CODE 1038 from the previous calibration is used.

CLK2 616 is derived by passing CLK_INJ 612 through delay circuitry 904B with its control voltage being 0 (see FIG. 9). FLIP MUX 1002 is used to flip CLK1 614 and CLK2 616 between the different paths (MUX3 1008 or MUX4 1010) depending on the polarity of VCTRL 212.

When the comparator 1018 toggles, the correction delay is beyond the stored delay. The toggling of the comparator 1018 is provided to control logic 604, and control logic 604 increments or decrements the INJECTION_SELECT signal 620 to change the phase that the injection clock is provided to in multi-phase oscillator 206. Control logic 604 also activates RST_INTEGRATOR 618 to reset the VCTRL 212 value provided by CDR 202.

Figure 11:
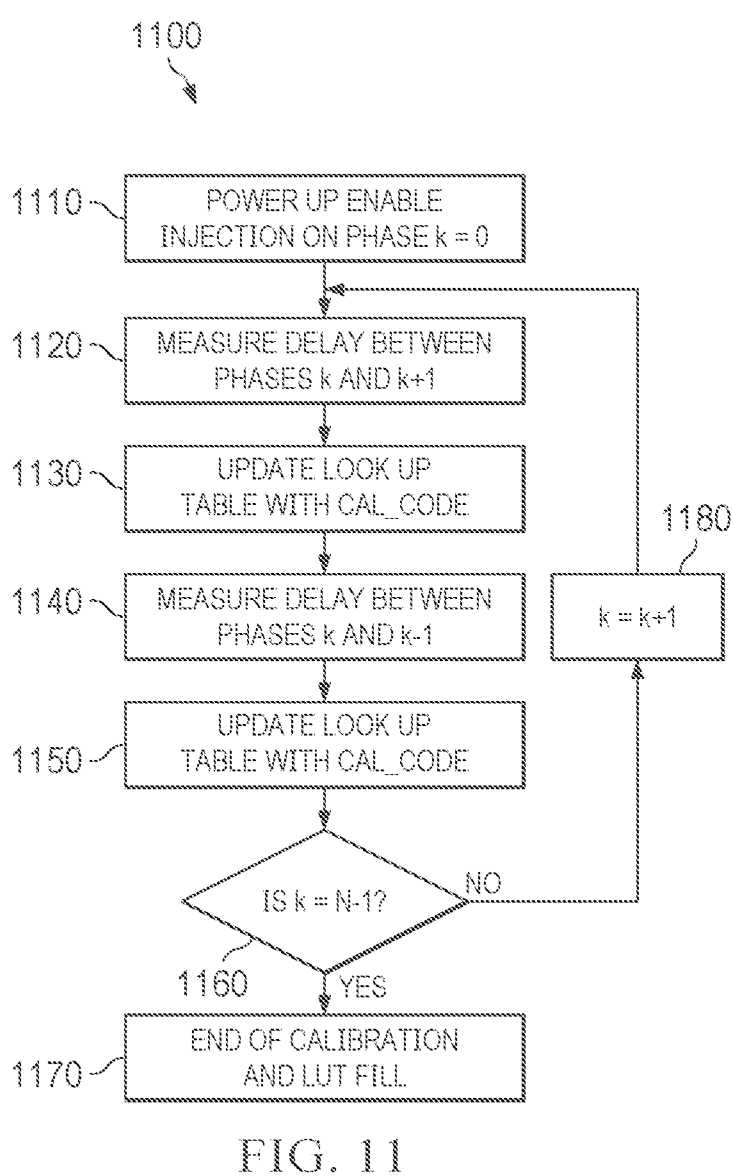
FIG. 11 is a flow diagram of an example method for calibration.

FIG. 11 is a flow diagram of an example method 1100 for calibration. The operations of method 1100 may be performed in any suitable order. Calibration circuitry 602 and/or control logic 604 may perform method 1100 in some examples. Any suitable hardware, software, or digital logic may perform method 1100 in some examples.

Method 1100 performs a calibration at power-up and stores the phase delays between phases of the multi-phase oscillator 206 in a lookup table (LUT). The LUT may be stored in memory 606 in one example. If the correction delay is to be compared against the stored delay, the calibration code CAL_CODE 1038 is read out from the LUT, and the comparison is performed. A new calibration can be performed in some examples (rather than reading out the stored value from the LUT), and the LUT can be updated at that time. This method may save power as the calibration is not run redundantly. Another advantage is that because all the pairs of adjacent phases are calibrated, any mismatch on the injection path delay between each of the phases is removed.

Method 1100 begins at 1110, where system 600 (or other systems described herein, such as system 200) begins operation and enables injection on the phase k=0 of multi-phase oscillator 206. Method 1100 then proceeds to 1120, where calibration circuitry 602 measures the delay between phases k and k+1.

Method 1100 continues at 1130, where the LUT is updated with the calibration code (CAL_CODE), which indicates the information of the delay between the two phases (k and k+1). The LUT may be stored in memory 606 in one example.

Method 1100 continues at 1140, where calibration circuitry measures the delay between phases k and k−1. Method 1100 continues at 1150, where the LUT is updated with the calibration code for phases k and k−1.

Method 1100 continues at 1160, where the delay circuitry 204 determines if k=N−1. Accordingly, the delay circuitry 204 or control logic 604 determines if the phase k is the last phase of the multi-phase oscillator 206. If k is not the last phase, method 1100 proceeds to 1180. If k is the last phase, method 1100 proceeds to 1170.

At 1180, if k is not the last phase, k is incremented to k+1 and method 1100 returns to 1120. Method 1100 then determines the calibration codes for the next phase, just as it did for the previous phase. The calibration codes are determined by calibration circuitry 602 in one example, and stored in the LUT in memory 606. The process continues until calibration has been performed for each phase.

If k=N−1 at 1160, method 1100 proceeds to 1170. At 1170, the calibration and LUT fill process, using the method 1100, is ended. The calibration codes are stored for each phase, and those codes may be read from the LUT as needed during the operation of system 600.

Figure 12:
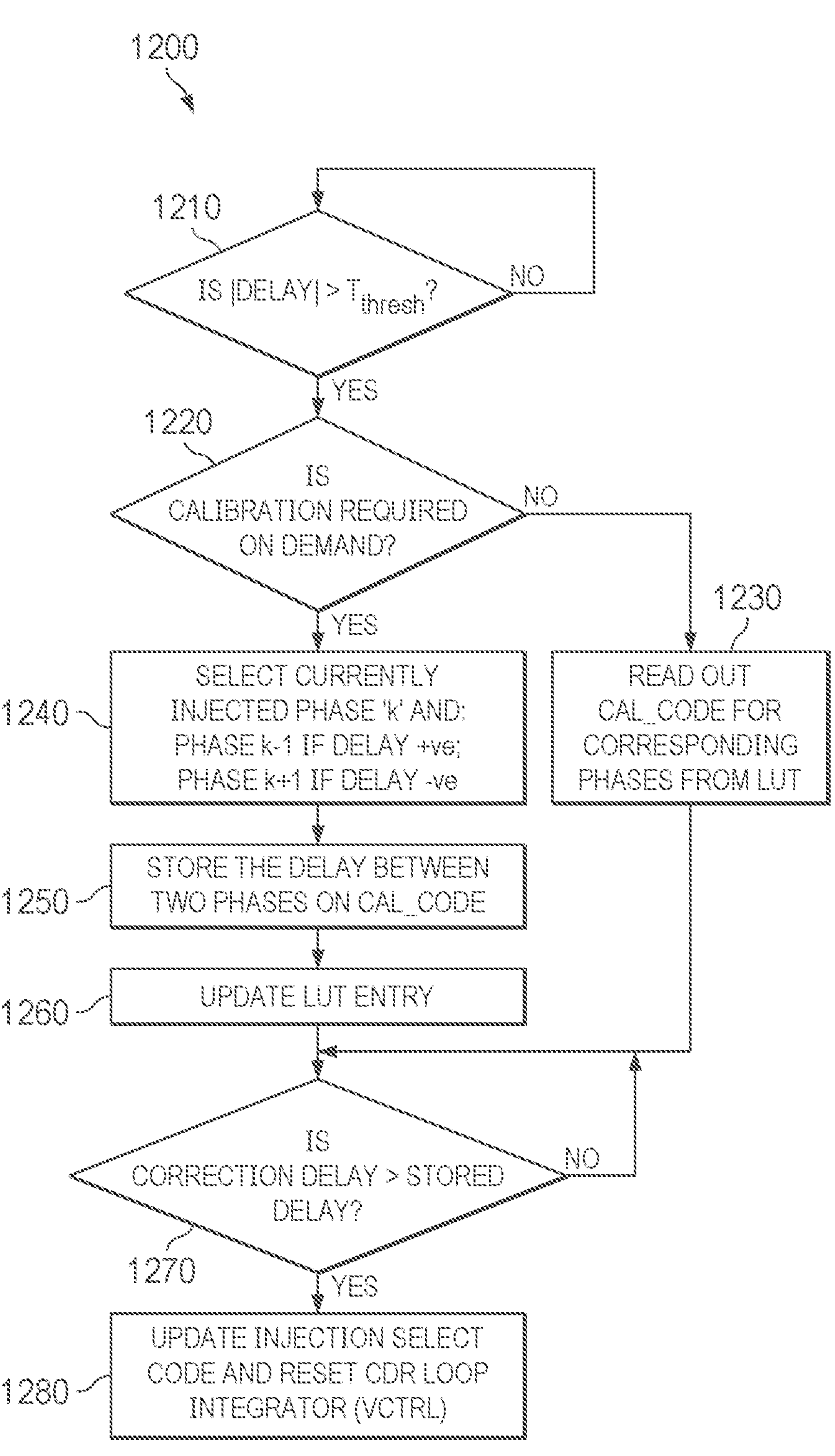
FIG. 12 is a flow diagram of an example method for calibration and selection of an injection phase.

FIG. 12 is a flow diagram of an example method 1200 for calibration and selection of the injection phase. The operations of method 1200 may be performed in any suitable order. Calibration circuitry 602 and/or control logic 604 may perform method 1200 in some examples. Any suitable hardware, software, or digital logic may perform method 1200 in some examples.

Method 1200 begins at 1210, where control logic 604 determines if the absolute value of the delay is greater than $T_{thresh}$. As described above, the threshold $T_{thresh}$ could be a value less than $T_{VCO}/N$, such as 70% of $T_{VCO}/N$. If the absolute value of the correction delay value is less than the threshold $T_{thresh}$, method 1200 remains at 1210. If the absolute value of the correction delay value exceeds the threshold $T_{thresh}$, method 1200 proceeds to 1220.

At 1220, control logic 604 determines if calibration is required on demand. If no calibration code is stored for the current phase k, then calibration is required, and method 1200 proceeds to 1240. If a calibration code is stored in the LUT, no calibration is required, and method 1200 proceeds to 1230.

At 1230, no calibration is required, and the calibration code for the corresponding phases is read out from the LUT. After 1230, method 1200 proceeds to 1270.

At 1220, if calibration is required, method 1200 proceeds to 1240. At 1240, calibration circuitry 602 selects the currently injected phase k of the multi-phase oscillator 206. Calibration circuitry 602 also selects the adjacent phase (k+1 or k−1) depending on whether the correction delay value is positive or negative. Phases k and k−1 are selected if the delay is positive, and phases k and k+1 are selected if the delay is negative.

Method 1200 then proceeds to 1250, where calibration circuitry 602 measures and stores the delay between the two selected phases (k and k+1, or k and k−1). The delay is stored in a LUT at 1260. The LUT may be stored in memory 606 in one example. The delay is stored so that the delay may be compared to a future correction delay value to determine if the injection phase of the multi-phase oscillator 206 is to be changed. In one example, the delay is measured using a successive approximation register (SAR) loop.

After the LUT is updated in 1260, method 1200 proceeds to 1270. At 1270, control logic 604 determines if the correction delay is greater than the stored delay. If not, the method can remain at 1270 because the injection phase does not have to be updated. If the correction delay is greater than the stored delay from the LUT, method 1200 proceeds to 1280.

At 1280, control logic 604 updates the injection select code (INJECTION_SELECT signal 620). The injection point is moved to the previous phase (k−1) if the delay is positive. The injection point is moved to next phase (k+1) if the delay is negative (e.g., advancement). Also, control logic 604 provides the RST_INTEGRATOR signal 618 to CDR 202 to reset VCTRL 212 and set the delay to zero. The CDR loop then continues to monitor and correct the error using delay circuitry 204 and the other components in system 600.

Figure 13:
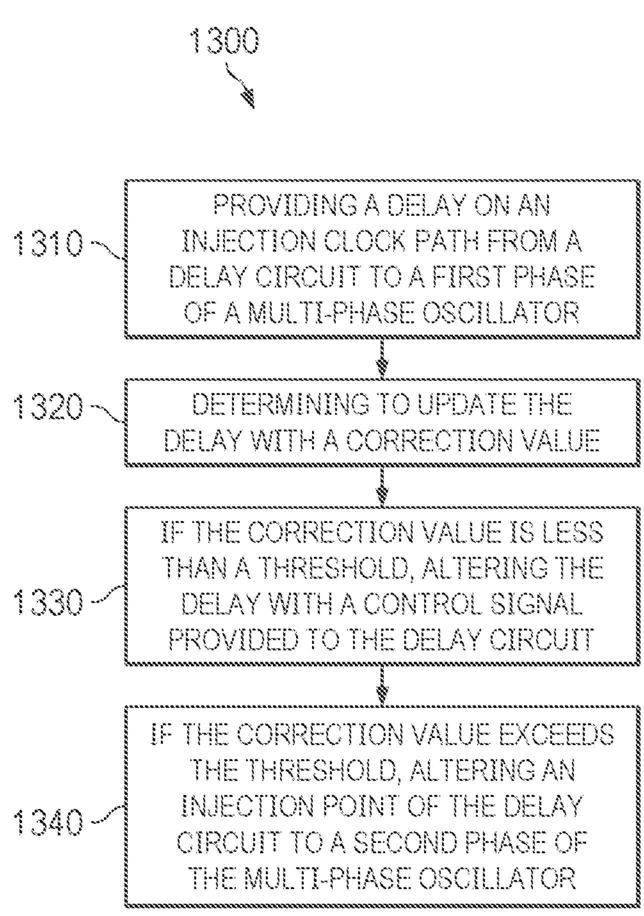
FIG. 13 is a flow diagram of an example method for updating the delay provided by delay circuitry.

FIG. 13 is a flow diagram of an example method 1300 for updating the delay provided by delay circuitry 204. The operations of method 1300 may be performed in any suitable order. The hardware components described above with respect to FIGS. 1-2, 6, and 9-10 may perform method 1300 in some examples. Any suitable hardware, software, or digital logic may perform method 1200 in some examples.

Method 1300 begins at 1310, where delay circuitry 204 provides a delay on an injection clock path to a first phase of a multi-phase oscillator 206. The multi-phase oscillator 206 may be a ring oscillator in one example. Delay circuitry 204 may be any suitable circuitry or hardware to delay a clock signal provided to an input of the multi-phase oscillator 206.

Method 1300 continues at 1320, where a CDR loop or CDR circuitry determines to update the delay with a correction value. The CDR circuitry (such as CDR 202) may determine to update the delay due to a difference between input data 210 and CLK_FB 218.

Method 1300 continues at 1330, where control logic 604 determines if the correction value is less than a threshold. If the correction value is less than the threshold, CDR 202 alters the delay by adjusting the control signal (e.g., VCTRL 212) provided to the delay circuitry 204. The delay may be adjusted in either direction (positive or negative).

Method 1300 continues at 1340, where control logic 604 determines that the correction value exceeds the threshold. If the correction value exceeds the threshold, the control logic 604 alters an injection point of the delay circuitry 204 to a second phase of the multi-phase oscillator 206. The threshold may be the delay difference between the first phase of the multi-phase oscillator 206 and an adjacent phase. If the correction value is larger than the threshold, the control logic 604 instructs delay circuitry 204 to change the injection point to an adjacent phase of the multi-phase oscillator 206. The thresholds between adjacent phases of the multi-phase oscillator 206 may be stored in a memory 606 or a lookup table.

In examples herein, no phase interpolator is used, as all the phases are delayed equivalently by the input injection delay. A delay of only $\pm T_{VCO}/N$ on the input side of the multi-phase oscillator 206 is used. The jitter specification on the delay cell or delay circuitry 204 is much more relaxed, due to the filtering effect of injection locking the multi-phase oscillator. Therefore, the power and area usage for the delay circuitry 204 also is relaxed.

The calibration scheme described herein also provides some example advantages. For a small error between the input data and the output clock, the phase drift will be slow. The calibration circuitry 602 can be used only after the delay is significantly larger. This duty cycling of the calibration circuitry 602 can save power. The calibration and control logic paths are the same, and therefore offsets and mismatches such as the comparator offset, RO cell delay mismatch, and path delay mismatch are accounted for. This solution also saves area and power as paths are reused.

In some examples, specifications on comparator offset, calibration delay cell range, and power consumption are relaxed compared to other systems. Also, because the delay is calibrated for every injection point, any mismatch between any of the RO phases does not affect the linearity. Linearity is better in examples herein compared to systems with an output phase interpolator. Examples described herein may be implemented in a high-speed serializer/deserializer. Other examples may be useful in a high speed digital video interface such as Flat Panel Display Link (FPD-Link). FPD-Link is used in a variety of applications, such as connecting the output from a graphics processing unit (GPU) to a display panel. FPD-Link is also useful for automotive applications such as navigation systems, vehicle entertainment systems, and backup cameras, as well as advanced driver assistance systems and autonomous vehicles.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A circuit, comprising:
- clock data recovery (CDR) circuitry having an input and an output;
- a delay circuit having an input coupled to the output of the CDR circuitry, and having an output;
- a multi-phase oscillator having an input coupled to the output of the delay circuit, and having an output; and
- a divider having an input coupled to the output of the multi-phase oscillator, and having an output coupled to the input of the CDR circuitry.

2. The circuit of claim 1, wherein the multi-phase oscillator is a ring oscillator.

3. The circuit of claim 1, wherein the CDR circuitry includes a phase detector and an integrator.

4. The circuit of claim 1, wherein the input of the delay circuit is a voltage control input.

5. The circuit of claim 1, wherein the delay circuit includes a multiplexer output, and the multi-phase oscillator includes multiple inputs coupled to the multiplexer output.

6. The circuit of claim 1, wherein the output of the multi-phase oscillator is coupled to an input of calibration circuitry.

7. The circuit of claim 6, wherein the calibration circuitry has an output coupled to the delay circuit and an output coupled to the CDR circuitry.

8. The circuit of claim 1, wherein the delay circuit includes a second input coupled to an injection clock path.

9. The circuit of claim 1, wherein the delay circuit is configured to:
- receive, at the input of the delay circuit, a first signal from the CDR circuitry; and
- provide a delay to an injection point for a first phase of the multi-phase oscillator based on the first signal.

10. The circuit of claim 9, wherein the input of the CDR is a first input of the CDR, and wherein the CDR is configured to:
- receive a second signal from the divider at the first input of the CDR;
- receive a third signal at the second signal of the CDR; and
- generate the first signal based on a first difference between the second and third signals.

11. The circuit of claim 10, wherein the CDR is configured to, in response to the first difference being higher than a first threshold, responsive to an updated delay value being lower than a second threshold, cause adjustment of the delay to the updated delay value.

12. The circuit of claim 11, wherein the first input of the multi-phase oscillator is a first injection point of the multi-phase oscillator, and wherein the CDR is configured to, in response to the updated delay value being higher than the second threshold, alter the injection point of the delay circuit to a second phase of the multi-phase oscillator.

13. The circuit of claim 11, wherein the second threshold is based on a clock period divided by a number of phases in the multi-phase oscillator.

14. The circuit of claim 11, wherein the second threshold is determined for each adjacent phase of the multi-phase oscillator.

15. A circuit, comprising:
- clock data recovery (CDR) circuitry having an input and an output;
- a delay circuit having an input coupled to the output of the CDR circuitry, and having an output;
- a multi-phase oscillator having an input coupled to the output of the delay circuit, and having an output;
- a divider having an input coupled to the output of the multi-phase oscillator, and having an output coupled to the input of the CDR circuitry; and
- a calibration circuit having a first input, a second input, and a third input, the first and second input coupled to the output of the delay circuit, and the third input coupled to the output of the multi-phase oscillator.

16. The circuit of claim 15, wherein the CDR circuitry includes a phase detector having an input coupled to the output of the divider.

17. The circuit of claim 16, wherein the phase detector has an output coupled to an input of an integrator/accumulator, and wherein the integrator/accumulator has an output coupled to the delay circuit.

18. The circuit of claim 15, wherein the multi-phase oscillator is a ring oscillator.

19. The circuit of claim 15, wherein the calibration circuit includes a multiplexer coupled to its third input, the multiplexer having an input coupled to the output of the multi-phase oscillator and an output coupled to a second multiplexer.

20. The circuit of claim 19, wherein the calibration circuit includes a second delay circuit and delay calibration circuitry.

21. The circuit of claim 20, wherein the calibration circuit includes a comparator having a first input coupled to a first delay calibration circuit and a second input coupled to a second delay calibration circuit, and having an output coupled to an input of an integrator.

* * * * *